US012665597B2

(12) United States Patent
Son et al.

(10) Patent No.: US 12,665,597 B2
(45) Date of Patent: Jun. 23, 2026

(54) SEMICONDUCTOR DEVICES WITH POWER GATING

(71) Applicant: SAMSUNG ELECTRONICS CO., LTD., Suwon-si (KR)

(72) Inventors: Yoo Seok Son, Suwon-si (KR); Se Hun Kim, Suwon-si (KR); Yun Ju Kwon, Suwon-si (KR); Won Soo Kim, Suwon-si (KR); Sae Na Yuk, Suwon-si (KR); Youn-Sik Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/791,652

(22) Filed: Aug. 1, 2024

(65) Prior Publication Data

US 2025/0219640 A1 Jul. 3, 2025

(30) Foreign Application Priority Data

Dec. 27, 2023 (KR) ........................ 10-2023-0193407

(51) Int. Cl.
| | |
|---|---|
| *H03K 19/00* | (2006.01) |
| *G06F 1/3237* | (2019.01) |
| *G06F 1/3287* | (2019.01) |
| *H03K 3/012* | (2006.01) |

(52) U.S. Cl.
CPC ....... *H03K 19/0016* (2013.01); *G06F 1/3237* (2013.01); *G06F 1/3287* (2013.01); *H03K 3/012* (2013.01)

(58) Field of Classification Search
CPC .. H03K 19/0016; H03K 3/012; G06F 1/3237; G06F 1/3287; G06F 1/10; G06F 1/06
See application file for complete search history.

(56) References Cited

U.S. PATENT DOCUMENTS

| | | | |
|---|---|---|---|
| 7,622,955 B2 | 11/2009 | Vilangudipit et al. | |
| 7,649,393 B2 | 1/2010 | Maeda | |
| 9,641,160 B2 | 5/2017 | Agarwal et al. | |
| 9,722,605 B2 | 8/2017 | Hoberman et al. | |
| 9,941,863 B2 | 4/2018 | Kim | |
| 2010/0308876 A1 | 12/2010 | Kawasaki et al. | |
| 2016/0359472 A1* | 12/2016 | Kim ..................... | H03K 3/0375 |
| 2017/0214395 A1* | 7/2017 | Kim ..................... | H03K 3/0375 |
| 2018/0300208 A1* | 10/2018 | Oruganti ............... | G06F 3/0683 |
| 2021/0357015 A1* | 11/2021 | Mangano .............. | G06F 1/3296 |

FOREIGN PATENT DOCUMENTS

KR    20170088765    8/2017

* cited by examiner

*Primary Examiner* — Lincoln D Donovan
*Assistant Examiner* — Amit R Bhatia
(74) *Attorney, Agent, or Firm* — Fish & Richardson P.C.

(57) ABSTRACT

A semiconductor device includes a retention circuit configured to retain a data value during a power gating operation, a non-retention circuit configured not to retain a data value during the power gating operation, a clock management unit (CMU) configured to provide a first operation clock to the retention circuit and provide a second operation clock to the non-retention circuit, and a power management unit (PMU) configured to provide a reference clock used to generate the first and second operation clocks to the CMU, generate a first isolation signal to permit a first signal to be output from the CMU, and generate a second isolation signal to permit a second signal to be output from the retention circuit and to permit a third signal to be output from the non-retention circuit.

19 Claims, 10 Drawing Sheets

SEMICONDUCTOR DEVICES WITH POWER GATING

CROSS-REFERENCE TO RELATED APPLICATION

This application claims priority from Korean Patent Application No. 10-2023-0193407, filed on Dec. 27, 2023 in the Korean Intellectual Property Office, and all the benefits accruing therefrom under 35 U.S.C. 119, the contents of this application being incorporated by reference herein in their entirety.

BACKGROUND

Power gating schemes are used to reduce power consumption in a semiconductor device. Components within the semiconductor device are maintained at a state in which power supply thereto is cut off during a power gating operation. When the power gating operation is stopped, the power is supplied to the components, which in turn operate.

The semiconductor device may include a retention circuit that retains a stored value during a power gating operation when power supply to the component is turned off, and a non-retention circuit that no longer retains the stored value (e.g., that loses the stored value or unreliably stores the stored value) when the power supply thereto is turned off.

SUMMARY

For purposes of this disclosure, it has been recognized that both a retention circuit and a non-retention circuit may be included in a semiconductor device. In this case, when the power gating operation is stopped and operations are resumed, an unknown value of the non-retention circuit may propagate to the retention circuit, thereby reducing reliability of the value stored in the retention circuit. Some implementations according to the present disclosure provide semiconductor devices with improved reliability, and corresponding operating methods.

The technical purposes of the present disclosure are not limited to the technical purposes as mentioned above, and other technical purposes as not mentioned will be clearly understood by those skilled in the art from following descriptions.

According to some aspects of the present disclosure, there is provided a semiconductor device comprises a retention circuit configured to retain a data value during a power gating operation, a non-retention circuit configured not to retain a data value during the power gating operation, a clock management unit (CMU) configured to provide a first operation clock to the retention circuit and provide a second operation clock to the non-retention circuit, and a power management unit (PMU) configured to provide a reference clock used to generate the first and second operation clocks to the CMU, generate a first isolation signal to permit a first signal to be output from the CMU, and generate a second isolation signal to permit a second signal to be output from the retention circuit and to permit a third signal to be output from the non-retention circuit.

According to some aspects of the present disclosure, there is provided a semiconductor device comprises a retention circuit configured to retain a data value during a power gating operation, a non-retention circuit configured not to retain a data value during the power gating operation, a clock management unit (CMU) configured to provide a first operation clock to the retention circuit, provide a second operation clock to the non-retention circuit, and output a response signal indicating that the first and second operation clocks have been outputted, a power management unit (PMU) configured to provide a reference clock used to generate the first and second operation clocks to the CMU, output a first isolation signal to permit an output of the CMU to be transmitted, and output a second isolation signal to permit an output of each of the retention circuit and the non-retention circuit to be transmitted, and a first logic gate configured to perform a first logical operation on the response signal output from the CMU and the first isolation signal and provide a first logical operation result to the PMU.

According to some aspects of the present disclosure, there is provided a method for operating a semiconductor device, wherein the semiconductor device includes a retention circuit configured to retain a data value during a power gating operation, a non-retention circuit configured not to retain a data value during the power gating operation, a clock management unit (CMU) configured to provide an operation clock to each of the retention circuit and the non-retention circuit, and a power management unit (PMU) configured to provide a reference clock used to generate the operation clock to the CMU, wherein the method comprises in response to that the power gating operation is stopped, outputting, by the PMU, the reference clock, outputting, by the PMU, a first isolation signal to permit an output of the CMU to be transmitted, outputting, by the PMU, to the CMU, a first request signal requesting the CMU to provide the operation clock to each of the retention circuit and the non-retention circuit, and receiving, by the PMU, from the CMU, a first response signal indicating that the operation clock has been outputted, based on the first isolation signal.

Specific details of other examples are included in the detailed description and drawings.

BRIEF DESCRIPTION OF DRAWINGS

The above and other aspects and features of the present disclosure will become more apparent by describing in detail examples thereof with reference to the attached drawings, in which:

FIG. 2 is a diagram showing a configuration of a power domain in FIG. 1;

FIGS. 4 to 7 are diagrams illustrating operations described with respect to FIG. 3;

FIG. 9 and FIG. 10 are diagrams illustrating operations described with respect to FIG. 8;

DETAILED DESCRIPTIONS

Figure 1:
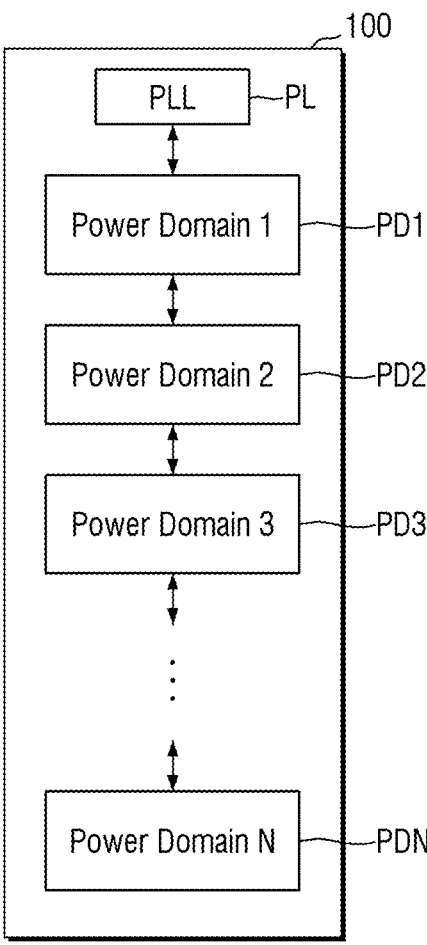
FIG. 1 is a diagram showing a semiconductor device according to some implementations.

Advantages and features of the present disclosure, and methods of achieving the advantages and features, will become apparent with reference to examples described later in detail together with the accompanying drawings. However, implementations of the present disclosure are not limited to the examples discussed herein, but may be implemented in various different forms. Thus, these examples are set forth only to make the present disclosure complete, and to completely inform the scope of the present disclosure to those of ordinary skill in the technical field to which the present disclosure belongs, and the present disclosure is only defined by the scope of the claims.

The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various implementations are illustrated and described further below. It will be understood that the description herein is not intended to limit the claims to the specific examples described. On the contrary, it is intended to cover alternatives, modifications, and equivalents as may be included within the spirit and scope of the present disclosure as defined by the appended claims.

The terminology used herein is directed to the purpose of describing particular examples only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

It will be understood that when an element or layer is referred to as being "connected to", or "coupled to" another element or layer, it may be directly connected to or coupled to another element or layer, or one or more intervening elements or layers therebetween may be present. In addition, it will also be understood that when an element or layer is referred to as being "between" two elements or layers, it may be the only element or layer between the two elements or layers, or one or more intervening elements or layers therebetween may also be present.

In descriptions of temporal relationships, for example, temporal precedent relationships between two events such as "after", "subsequent to", "before", etc., another event may occur therebetween unless "directly after", "directly subsequent" or "directly before" is not indicated.

When a certain implementation may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the spirit and scope of the present disclosure.

The features of the various examples of the present disclosure may be partially or entirely combined with each other, and may be technically associated with each other or operate with each other. The features may be implemented independently of each other and may be implemented together in an association relationship.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples according to the technical idea of the present disclosure will be described with reference to the attached drawings.

FIG. 1 is a diagram showing a semiconductor device according to some implementations. Referring to FIG. 1, a semiconductor device 100 may include a PLL (Phase Lock Loop) PL and a plurality of power domains PD1 to PDN (where N is a natural number of 2 or larger).

The PLL PL may generate a source clock used to generate operation clocks used in the semiconductor device 100. In this example, the PLL PL acts as a device that generates the source clock. However, implementations are not limited thereto.

Each of the plurality of power domains PD1 to PDN may perform data processing via an internal component thereof using a predetermined power and clock. For example, the first power domain PD1 may perform first processing using a first power and a first clock. The second power domain PD2 may perform second processing using a second power and a second clock. The third power domain PD3 may perform third processing using a third power and a third clock. The N-th power domain PDN may perform N-th processing using a N-th power and a N-th clock. In some implementations, the powers and clocks respectively used by the power domains PD1 to PDN may be different from each other. However, implementations are not limited thereto.

Figure 2:
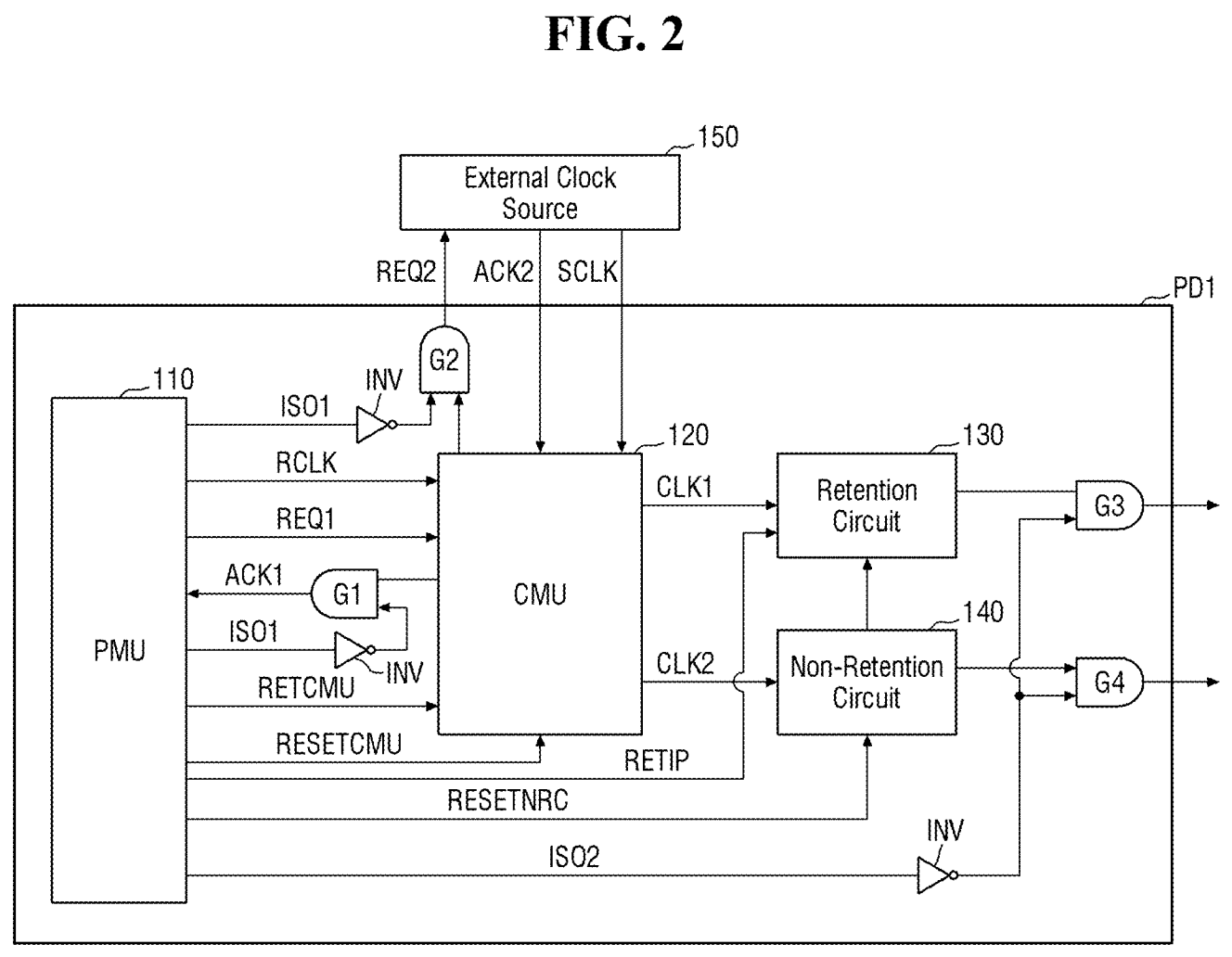

FIG. 2 is a diagram showing a configuration of a power domain, e.g., a power domain of FIG. 1. A configuration of the first power domain PD1 is shown by way of example. However, the configuration shown in FIG. 2 is equally applicable to other power domains (e.g., PD2 to PDN in FIG. 1).

Referring to FIG. 2, the first power domain PD1 may include a power management unit (PMU) 110, a clock management unit (CMU) 120, a retention circuit 130, and a non-retention circuit 140.

In some implementations, the first power domain PD1 may include additional components. Moreover, in some implementations, each of the number of retention circuits 130 and the number of non-retention circuits 140 may be greater than what is shown. Moreover, in some implementations, each of the retention circuit 130 and the non-retention circuit 140 may represent a partial area of a circuit. That is, a partial area of the circuit may correspond to the retention circuit 130, and the other partial area of the circuit may correspond to the non-retention circuit 140, e.g., such that the circuits 130, 140 need not be separate components.

The PMU 110 may provide power to and manage components included in the first power domain PD1. Power may always be supplied to the PMU 110 while the first power domain PD1 performs a power gating operation. That is, the PMU 110 may belong to an always powered-on domain.

While the first power domain PD1 performs a power gating operation, power from the PMU 110 may not be supplied to the CMU 120, the retention circuit 130, and the non-retention circuit 140. Accordingly, power consumption of a semiconductor device including the first power domain PD1 (e.g., semiconductor device 100 in FIG. 1) may be reduced while the first power domain PD1 performs the power gating operation.

At and after a time point at which the first power domain PD1 stops the power gating operation, the PMU 110 may supply the power to the CMU 120, the retention circuit 130, and the non-retention circuit 140.

In addition, the PMU 110 may provide a plurality of control signals to the CMU 120, the retention circuit 130, and the non-retention circuit 140 such that the CMU 120, the retention circuit 130, and the non-retention circuit 140 reliably operate after the power gating operation is stopped.

The PMU 110 may generate a reference clock RCLK used by the CMU 120 to generate first and second operation clocks CLK1 and CLK2, and may provide the generated reference clock RCLK to the CMU 120. The CMU 120 may generate the first and second operation clocks CLK1 and CLK2 based on the reference clock RCLK provided from the PMU 110, may provide the first operation clock CLK1 to the retention circuit 130, and may provide the second operation clock CLK2 to the non-retention circuit 140.

The PMU 110 may provide, to the CMU 120, a first request signal REQ1 to request the CMU 120 to provide the first and second operation clocks CLK1 and CLK2 to the retention circuit 130 and the non-retention circuit 140, respectively.

The PMU 110 may generate and output a first isolation signal ISO1 that permits transmission of an output of the CMU 120. For example, a first response signal ACK1 of the CMU 120 may be transmitted from the CMU 120 to the PMU 110 based on the first isolation signal ISO1. Furthermore, a second request signal REQ2 of the CMU 120 may be transmitted from the CMU 120 to an external clock source 150 to the PMU 110 based on the first isolation signal ISO1.

The PMU 110 may generate and output a second isolation signal ISO2 that permits transmission of an output of each of the retention circuit 130 and the non-retention circuit 140. For example, the output of the retention circuit 130 may be transmitted out of the first power domain PD1 based on the second isolation signal ISO2. Furthermore, the output of the non-retention circuit 140 may be transmitted out of the first power domain PD1 based on the second isolation signal ISO2.

In some implementations, the PMU 110 may generate separately the first isolation signal ISO1 which permits or causes transmission of the output of the CMU 120, and the second isolation signal ISO2 which permits or causes transmission of the output of each of the retention circuit 130 and the non-retention circuit 140.

Using the first isolation signal ISO1, the PMU 110 may monitor an operation of the CMU 120. Further, using the first isolation signal ISO1, the PMU 110 may control the CMU 120 to request and receive a clock to and from the external clock source 150 in a full hand shaking manner.

Using the second isolation signal ISO2, the PMU 110 may secure reliability of the output of each of the retention circuit 130 and the non-retention circuit 140 and may permit the transmission of the output of each of the retention circuit 130 and the non-retention circuit 140 to an external component while the reliability of the output of each of the retention circuit 130 and the non-retention circuit 140 is secured.

The PMU 110 may provide the CMU 120 with a first retention signal RETCMU which controls a retention mode of the CMU 120. Based on the first retention signal RETCMU, the CMU 120 may operate in a retention mode or a non-retention mode. Furthermore, the PMU 110 may provide the retention circuit 130 with a second retention signal RETIP which controls a retention mode of the retention circuit 130. Based on this second retention signal RETIP, the retention circuit 130 may operate in a retention mode or a non-retention mode.

The PMU 110 may provide the CMU 120 with a first reset signal RESETCMU which initializes an internal state of the CMU 120. The PMU 110 may provide the non-retention circuit 140 with a second reset signal RESETNRC which initializes an internal state of the non-retention circuit 140.

The CMU 120 may receive the reference clock RCLK from the PMU 110 and/or may receive a source clock SCLK from the external clock source 150, and may generate the first and second operation clocks CLK1 and CLK2 respectively required for the operations of the retention circuit 130 and a non-retention circuit 140 based on the received clock.

While the power gating operation is performed, the CMU 120 may prevent the first and second operation clocks CLK1 and CLK2 from being provided to the retention circuit 130 and the non-retention circuit 140 to reduce power consumption. When the power gating operation is stopped, the CMU 120 may receive the first request signal REQ1 from the PMU 110 and, in response thereto, may provide the first and second operation clocks CLK1 and CLK2 to the retention circuit 130 and the non-retention circuit 140, respectively, for the operations of the retention circuit 130 and the non-retention circuit 140.

The CMU 120 provides the first and second operation clocks CLK1 and CLK2 to the retention circuit 130 and the non-retention circuit 140, respectively, and then, may transmit, to the PMU 110, the first response signal ACK1 indicating that the first and second operation clocks CLK1 and CLK2 have been outputted.

In some implementations, the first response signal ACK1 may be transmitted from the CMU 120 to the PMU 110 based on the first isolation signal ISO1 output from the PMU 110. In some implementations, the first power domain PD1 may include a first logic gate G1 that performs a first logical operation on the first response signal ACK1 output from the CMU 120 and the first isolation signal ISO1 inverted through an inverter INV and then provides a first logical operation result to the PMU 110. In some implementations, the first logic gate G1 may include an AND gate configured to perform an AND operation on the first response signal ACK1 and the first isolation signal ISO1 inverted through the inverter INV. However, implementations are not limited thereto. For example, the inverter INV may be omitted.

In some implementations, the CMU 120 may transmit the second request signal REQ2 to request the source clock SCLK to the external clock source 150 located out of the first power domain PD1 in order to generate the first and second operation clocks CLK1 and CLK2.

In some implementations, this external clock source 150 may be, for example, a PLL (e.g., PLL PL in FIG. 1). In some implementations, the external clock source 150 may be, for example, a CMU of another power domain (e.g., PD2 to PDN in FIG. 1).

In some implementations, the second request signal REQ2 may be transmitted from the CMU 120 to the external clock source 150 based on the first isolation signal ISO1 output from the PMU 110. In some implementations, the first power domain PD1 may include a second logic gate G2 which performs a second logical operation on the second request signal REQ2 output from the CMU 120 and the first isolation signal ISO1 inverted through the inverter INV and provides a second logical operation result to the external clock source 150. In some implementations, the second logic gate G2 may include an AND gate configured to perform an AND operation on the second request signal REQ2 and the first isolation signal ISO1 inverted through the inverter INV. However, implementations are not limited thereto. For example, the inverter INV may be omitted.

In response to the second request signal REQ2, the CMU 120 may receive the second response signal ACK2 from the external clock source 150. The CMU 120 may receive the source clock SCLK from the external clock source 150.

In some implementations, the CMU 120 may perform a retention operation. While the power gating operation is performed, the CMU 120 may operate in a retention mode based on the first retention signal RETCMU received from the PMU 110. After the power gating operation is stopped, the retention mode may be deactivated based on the first retention signal RETCMU received from the PMU 110. In response, the CMU 120 may operate in a non-retention mode.

In some implementations, in order to prevent the CMU from receiving an abnormal input from an external source and malfunctioning, the CMU 120 may receive an external blocking signal from the PMU 110.

The CMU 120 may include, for example, a clock mux unit, a clock dividing unit, a dividing circuit state machine, a clock stop state machine, a clock gating unit, a clock gating state machine, and/or the like. Using these and/or other suitable components, the CMU 120 may generate the first and second operation clocks CLK1 and CLK2 from at least one of the reference clock RCLK and the source clock SCLK.

The retention circuit 130 may operate based on and/or in response to receiving the first operation clock CLK1 from the CMU 120. In some implementations, the retention circuit 130 may receive an output value from the non-retention circuit 140, perform an operation on the output value, and output an operation result value.

In some implementations, an output value of the retention circuit 130 (e.g., the operation result value) may be output out of the first power domain PD1, based on the second isolation signal ISO2 output from the PMU 110. In some implementations, the first power domain PD1 includes a third logic gate G3 which performs a third logical operation on the output signal output from the retention circuit 130 and the second isolation signal ISO2 inverted through the inverter INV, and outputs a third logical operation result out of the first power domain PD1. In some implementations, this third logic gate G3 may include an AND gate configured to perform an AND operation on the output signal output from the retention circuit 130 and the second isolation signal ISO2 inverted through the inverter INV. However, implementations are not limited thereto. For example, the inverter INV may be omitted.

The non-retention circuit 140 may operate based on and/or in response to receiving the second operation clock CLK2 from the CMU 120. In some implementations, the non-retention circuit 140 may output an output value to the retention circuit 130. In some implementations, the non-retention circuit 140 may include, for example, a sync reset flip flop. However, implementations are not limited thereto.

In some implementations, the output value of the non-retention circuit 140 may be output out of the first power domain PD1, based on the second isolation signal ISO2 output from the PMU 110. In some implementations, the first power domain PD1 may include a fourth logic gate G4 that performs a fourth logical operation on the output signal output from the non-retention circuit 140 and the second isolation signal ISO2 inverted through the inverter INV, and outputs a fourth logical operation result out of the first power domain PD1. In some implementations, this fourth logic gate G3 may include an AND gate which performs an AND operation on the output signal output from the non-retention circuit 140 and the second isolation signal ISO2 inverted through the inverter INV. However, implementations are not limited thereto. For example, the inverter INV may be omitted.

Figure 3:
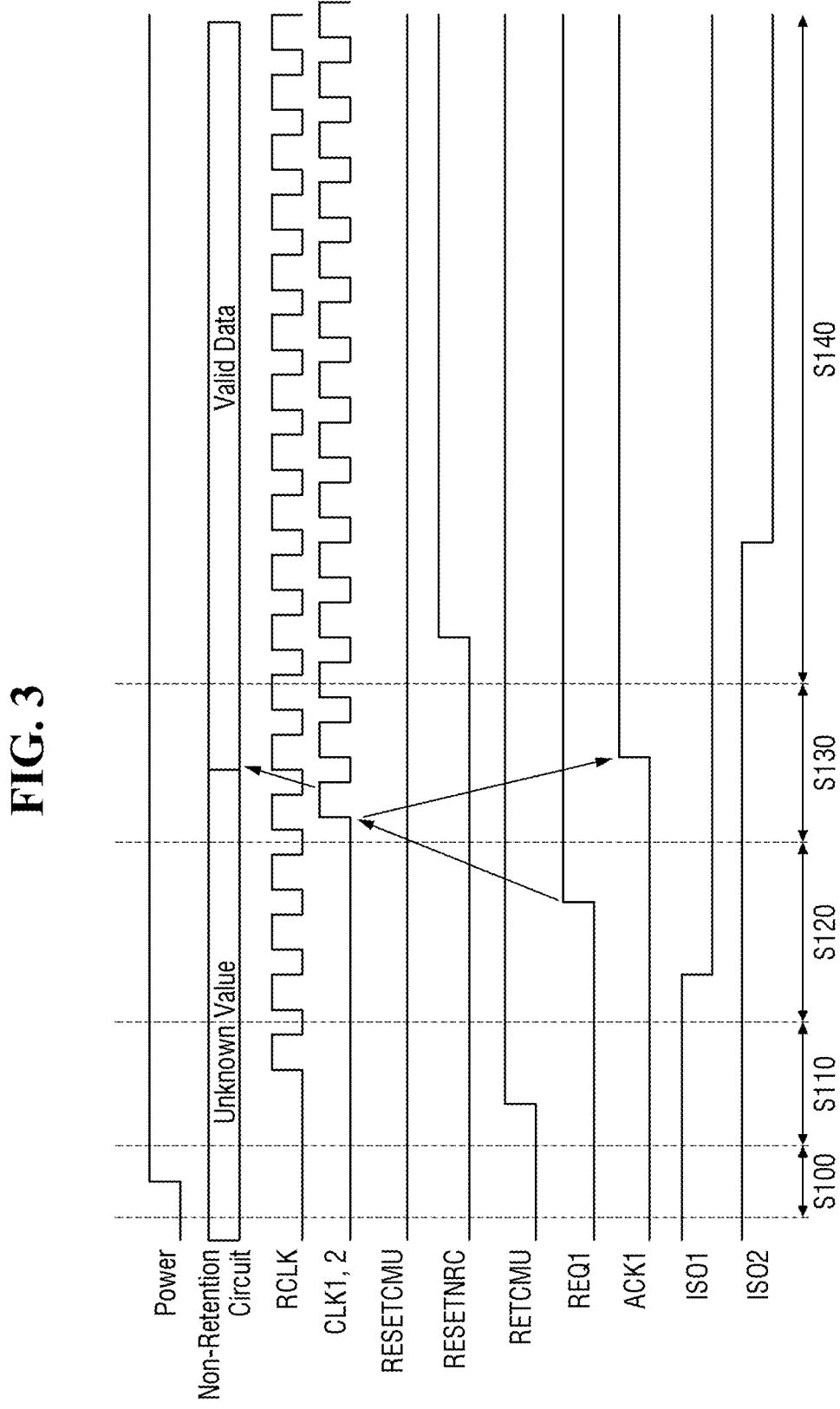
FIG. 3 is a timing diagram showing operations of an example of a semiconductor device when a power gating operation is stopped.
Figure 4:
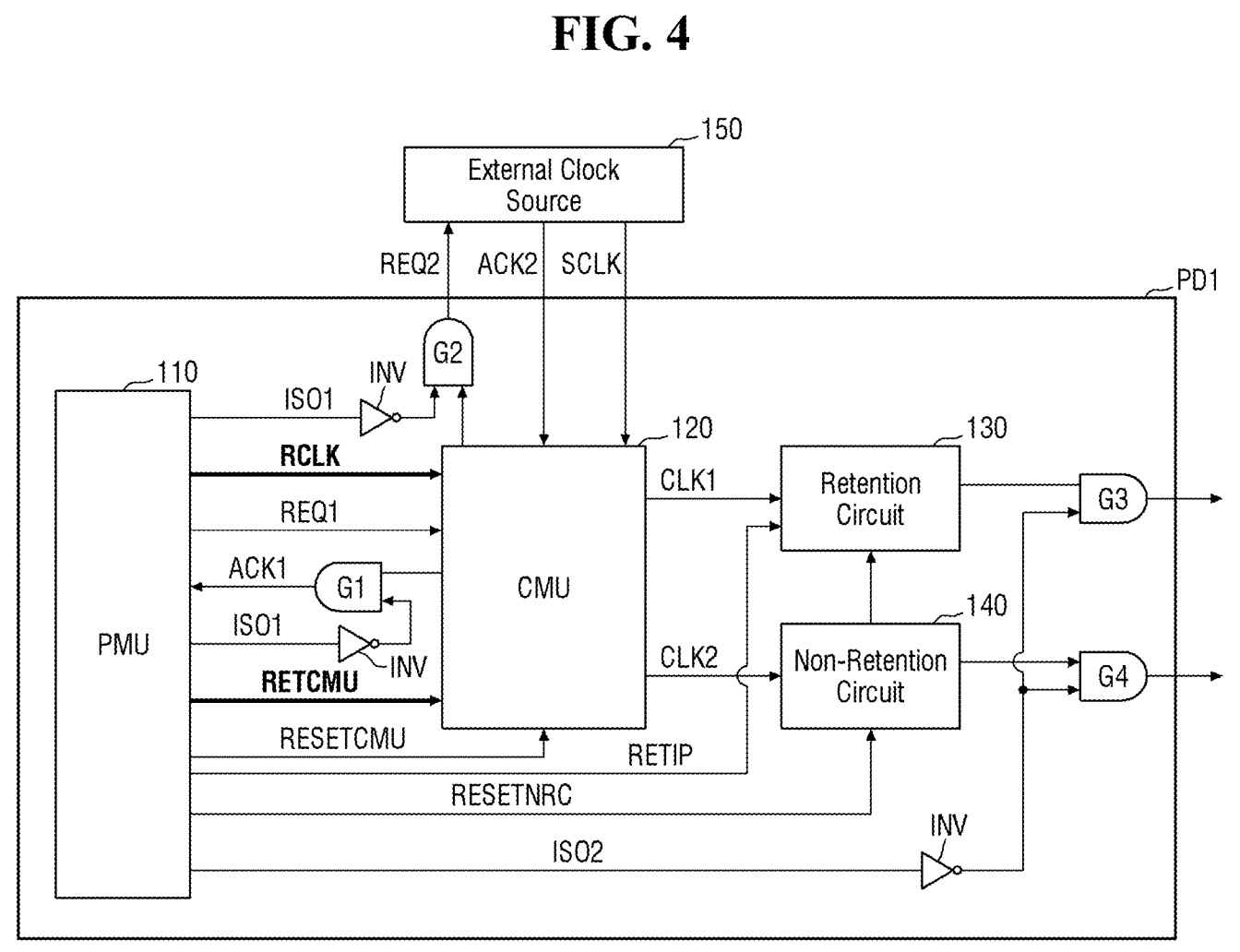

FIG. 3 is a timing diagram showing operations of a semiconductor device (e.g., the semiconductor device 100 and first power domain PD1 of FIGS. 1-2) when a power gating operation is stopped. FIGS. 4 to 7 are diagrams illustrating the operations shown in FIG. 3.

First, referring to FIG. 3, in time interval S100, the power gating operation has been or is completed and, thus, power is supplied. For example, referring to FIG. 3 and FIG. 4, the PMU 110 may switch a signal (power) from L (logic low) to H (logic high) to end the power gating operation. Accordingly, the power may be supplied to internal transistors of the CMU 120, the retention circuit 130, and the non-retention circuit 140, so that all of the CMU 120, the retention circuit 130, and the non-retention circuit 140 are in an operable state.

Next, referring to FIG. 3, the CMU 120 is controlled in a non-retention mode and the reference clock is provided to the CMU in time interval S110. For example, referring to FIGS. 3 and 4, the PMU 110 may switch the first retention signal RETCMU to be provided to the CMU 120 from L to H, thereby deactivating the retention mode of the CMU 120. Additionally, the PMU 110 may provide the reference clock RCLK (e.g., a periodic clock signal) to the CMU 120.

Next, referring to FIG. 3, the PMU 110 permits the output of the CMU 120 to be transmitted such that the CMU 120, which stops operating in the retention mode, may communicate, and the PMU 110 requests the CMU 120 to generate and output the operation clock in time interval S120.

Figure 5:
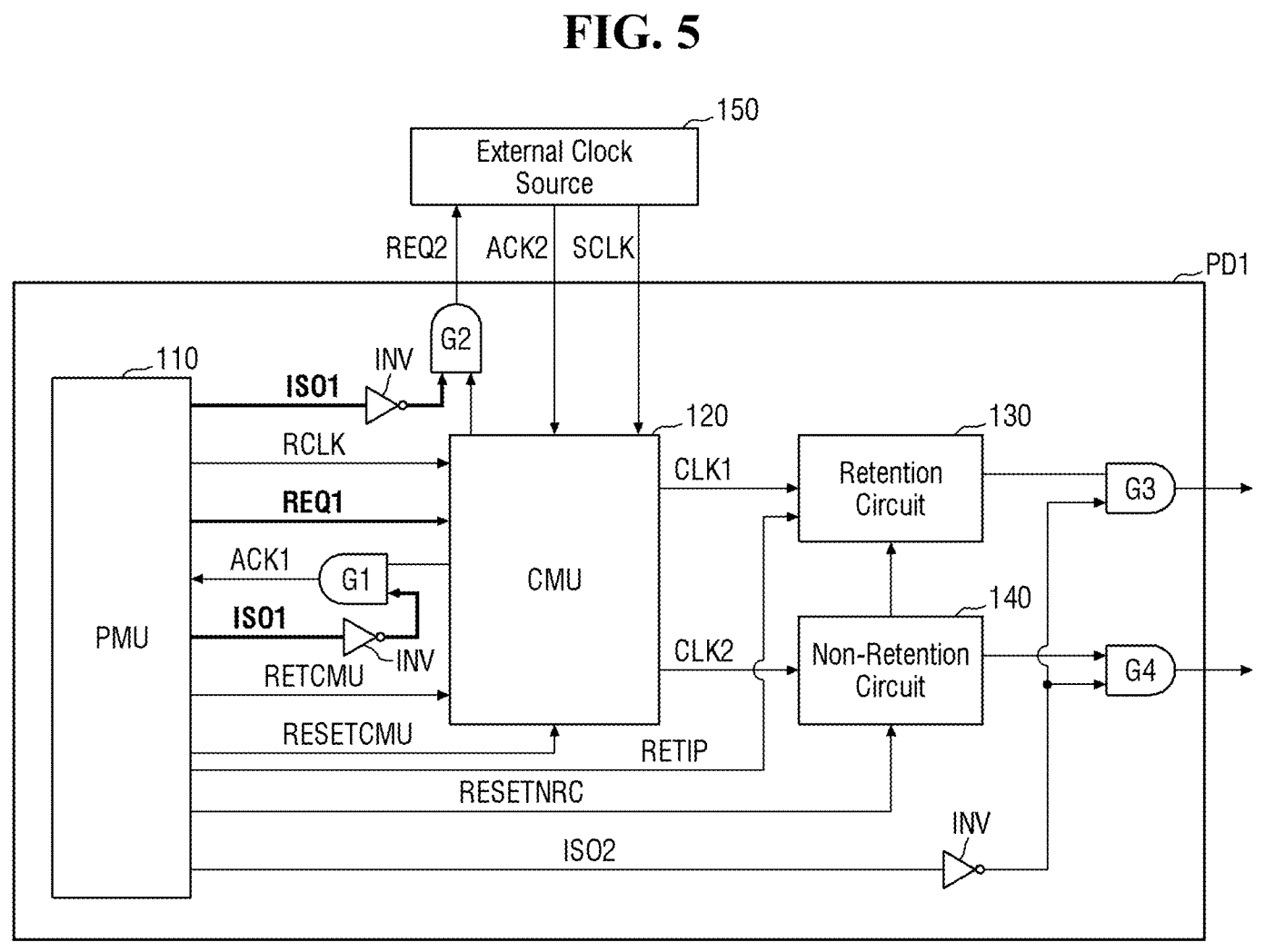

For example, referring to FIGS. 3 and 5, the PMU 110 may switch the first isolation signal ISO1 from H to L to permit the CMU 120 output to be transmitted. While the first isolation signal ISO1 maintains H, a L signal is maintained at a first input terminal of each of the first logic gate G1 and the second logic gate G2. Thus, each of the output of the first logic gate G1 and the output of the second logic gate G2 always maintains L. That is, signal levels of the first response signal ACK1 and the second request signal REQ2 output from the CMU 120 are not transmitted to the PMU 110 and the external clock source 150, respectively.

However, when the PMU 110 switches the first isolation signal ISO1 from H to L, the H signal may be maintained at the first input terminal of each of the first logic gate G1 and the second logic gate G2. Thus, the output of the first logic gate G1 may vary depending on the signal level of the first response signal ACK1 output from the CMU 120, and the output of the second logic gate G2 may vary depending on the signal level of the request signal REQ2 output from the CMU 120.

In implementations in which the PMU 110 may switch the first isolation signal ISO1 from L to H to permit the output of the CMU 120 to be transmitted, the inverter INV may be omitted. For example, the inverter INV may be omitted or included depending on a manner in which the first isolation signal ISO1 is designed.

In addition, in time interval S120, the PMU 110 may transmit, to the CMU 120, the first request signal REQ1 requesting the CMU 120 to generate and transmit the first and second operation clocks CLK1 and CLK2 to the retention circuit 130 and the non-retention circuit 140, respectively. For example, the PMU 110 may switch the first request signal REQ1 from L to H.

Next, referring to FIG. 3, in time interval S130, the CMU 120 outputs the operation clock CLK2 to reset the non-retention circuit 140. Further, the CMU 120 transmits a response signal ACK1 indicating that the operation clock has been output.

Figure 6:
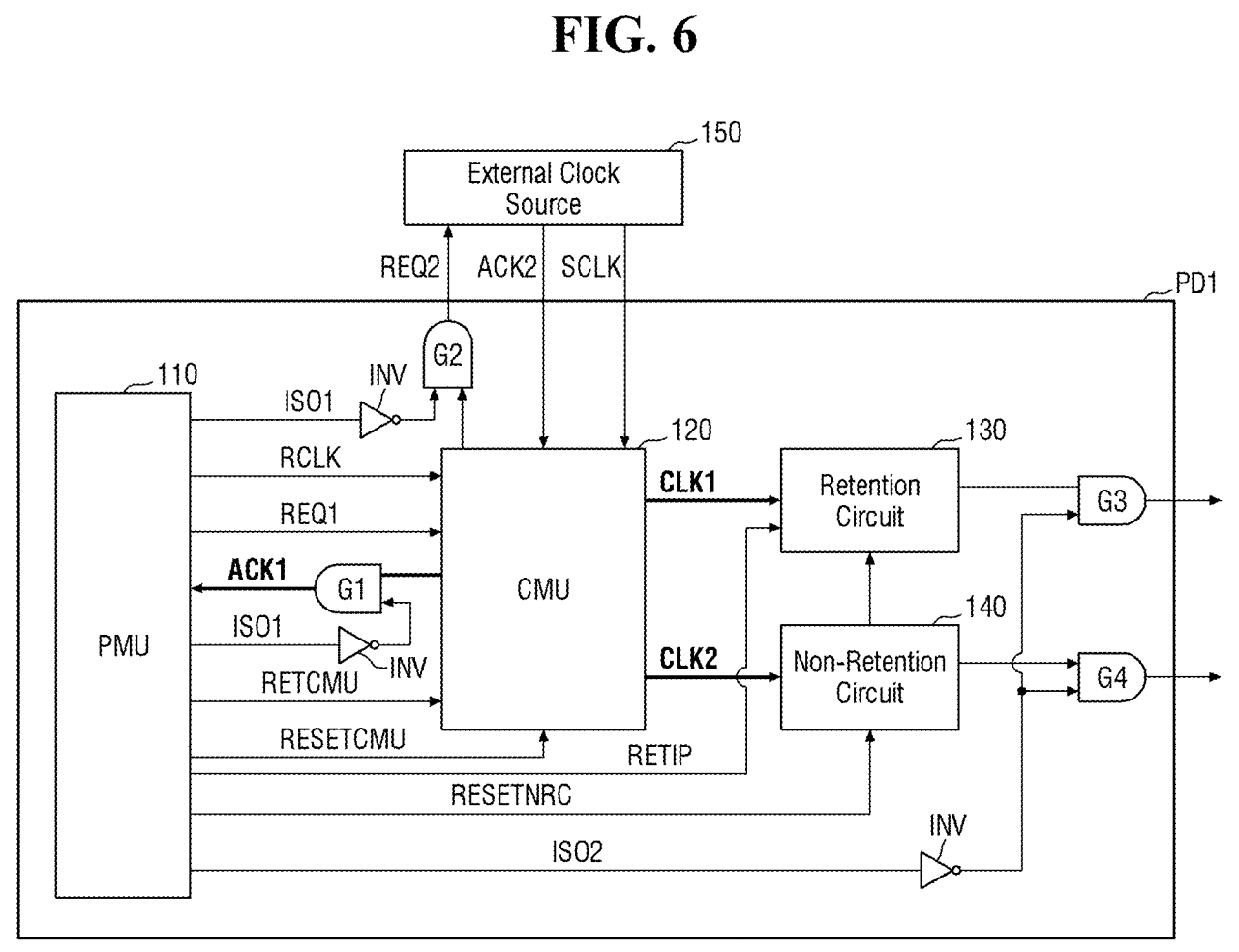

Referring to FIG. 3 and FIG. 6, in response to the first request signal REQ1 provided from the PMU 110, the CMU 120 may output the first operation clock CLK1 to the retention circuit 130, and may output the second operation clock CLK2 to the non-retention circuit 140.

In time interval S130, the second reset signal RESETNRC provided from the PMU 110 to the non-retention circuit 140 continuously maintains L which resets the non-retention circuit 140. While the second reset signal RESETNRC maintains L, the non-retention circuit 140 receives the second operation clock CLK2, so that the internal circuits of the non-retention circuit 140 may be reset. When (e.g., only when) the internal circuits of the non-retention circuit 140 are reset in this way, values stored in the non-retention circuit 140 may be trusted as valid data.

The first reset signal RESETCMU provided from the PMU 110 to the CMU 120 continuously maintains H. Thus, the CMU 120 is not reset by the first reset signal RESETCMU when the power gating operation is stopped.

After outputting the first operation clock CLK1 to the retention circuit 130 and the second operation clock CLK2 to the non-retention circuit 140, the CMU 120 may output the first response signal ACK1 indicating that the first operation clock CLK1 has been output to the retention circuit 130, and the second operation clock CLK2 has been output to the non-retention circuit 140. For example, the CMU 120 may switch the first response signal ACK1 from L to H.

As described above, due to the first isolation signal ISO1 being switched, the H signal is maintained at the first input terminal of the first logic gate G1, so that the first response signal ACK1 switching from L to H may be delivered to the PMU 110. Accordingly, the PMU 110 may monitor whether the CMU 120 has completed outputting of the operation clocks CLK1 and CLK2.

Next, referring to FIG. 3, in time interval S140, the reset of the non-retention circuit 140 is deactivated, and the output of the power domain PD1 is transmitted out.

Figure 7:
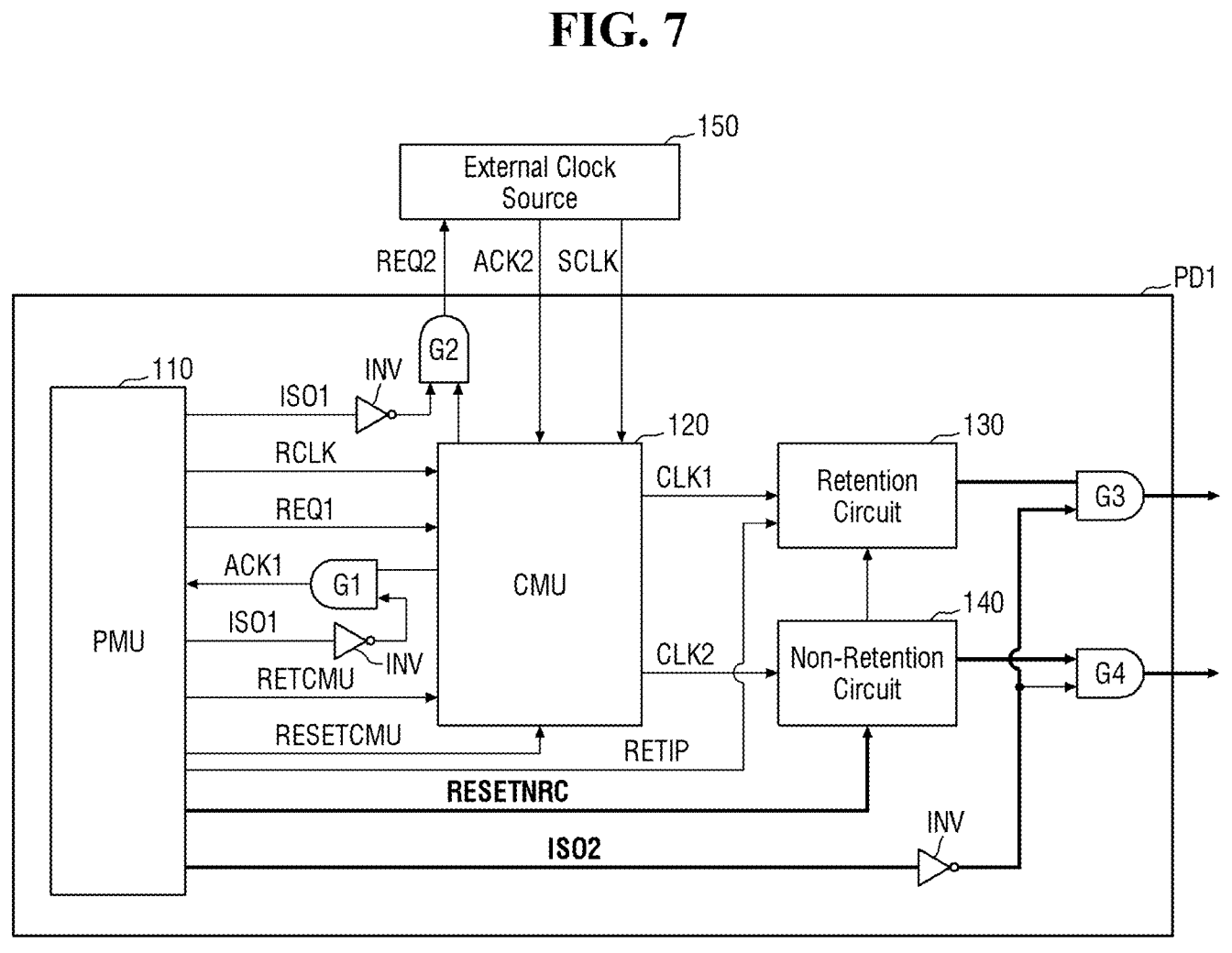

Referring to FIG. 3 and FIG. 7, upon receiving the first response signal ACK1 from the CMU 120, the PMU 110 may determine that an operation state of each of the retention circuit 130 and the non-retention circuit 140 is in a trustworthy state. Based on, or in response to, this determination, the PMU 110 may switch the second reset signal RESETNRC from L to H to deactivate the reset mode of the non-retention circuit 140. In addition, the PMU 110 switches the second isolation signal ISO2 from H to L in order to permit the output signal of each of the retention circuit 130 and the non-retention circuit 140 to be output out of the power domain PD1.

When the PMU 110 switches the second isolation signal ISO2 from H to L, the H signal is maintained at the first input terminal of each of the third logic gate G3 and the fourth logic gate G4. Thus, the output of the third logic gate G3 may vary depending on the signal level of the signal output from the retention circuit 130, and the output of the fourth logic gate G4 may vary depending on the signal level of the signal output from the non-retention circuit 140.

In implementations in which the PMU 110 switches the second isolation signal ISO2 from L to H to permit the output signal of each of the retention circuit 130 and the non-retention circuit 140 to be output out of the power domain PD1, the inverter INV may be omitted. For example, the inverter INV may be omitted or included depending on a manner in which the second isolation signal ISO2 is designed.

Although FIG. 3 shows an example in which the PMU 110 switches the second reset signal RESETNRC from L to H and then switches the second isolation signal ISO2 from H to L, implementations are not limited thereto. For example, the PMU 110 may switch the second isolation signal ISO2 from H to L and then may switch the second reset signal RESETNRC from L to H.

In the above description of FIG. 3, the CMU 120 is described as receiving the reference clock RCLK from the PMU 110 and outputting the first and second operation clocks CLK1 and CLK2 based on the reference clock RCLK. Hereinafter, with reference to FIGS. 8 to 10, an example in which the CMU 120 receives the source clock SCLK from the external clock source 150 and outputs the first and second operation clocks CLK1 and CLK2 based on the source clock SCLK will be described.

Figure 8:
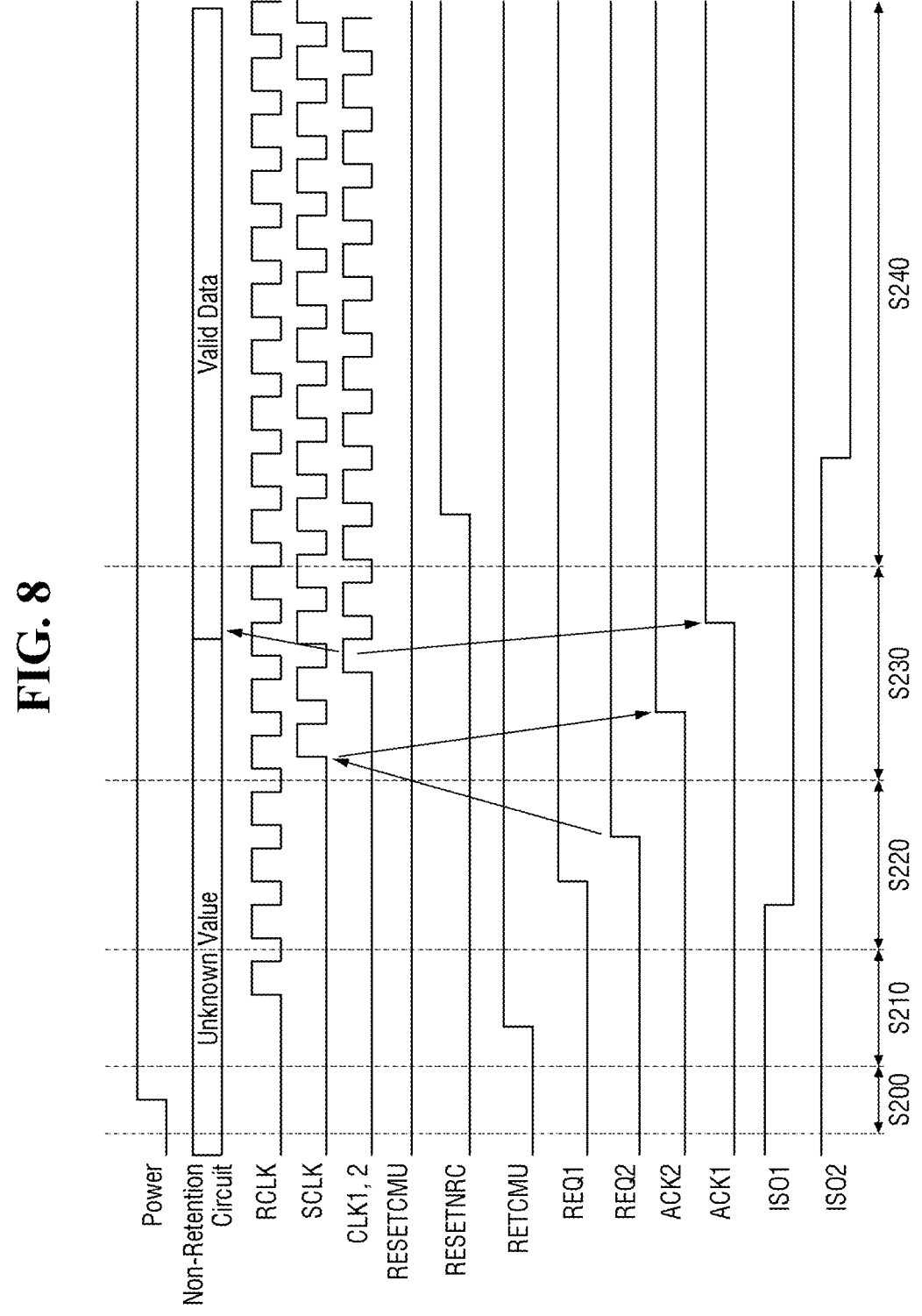
FIG. 8 is a timing diagram showing operations of a semiconductor device when a power gating operation is stopped.
Figure 9:
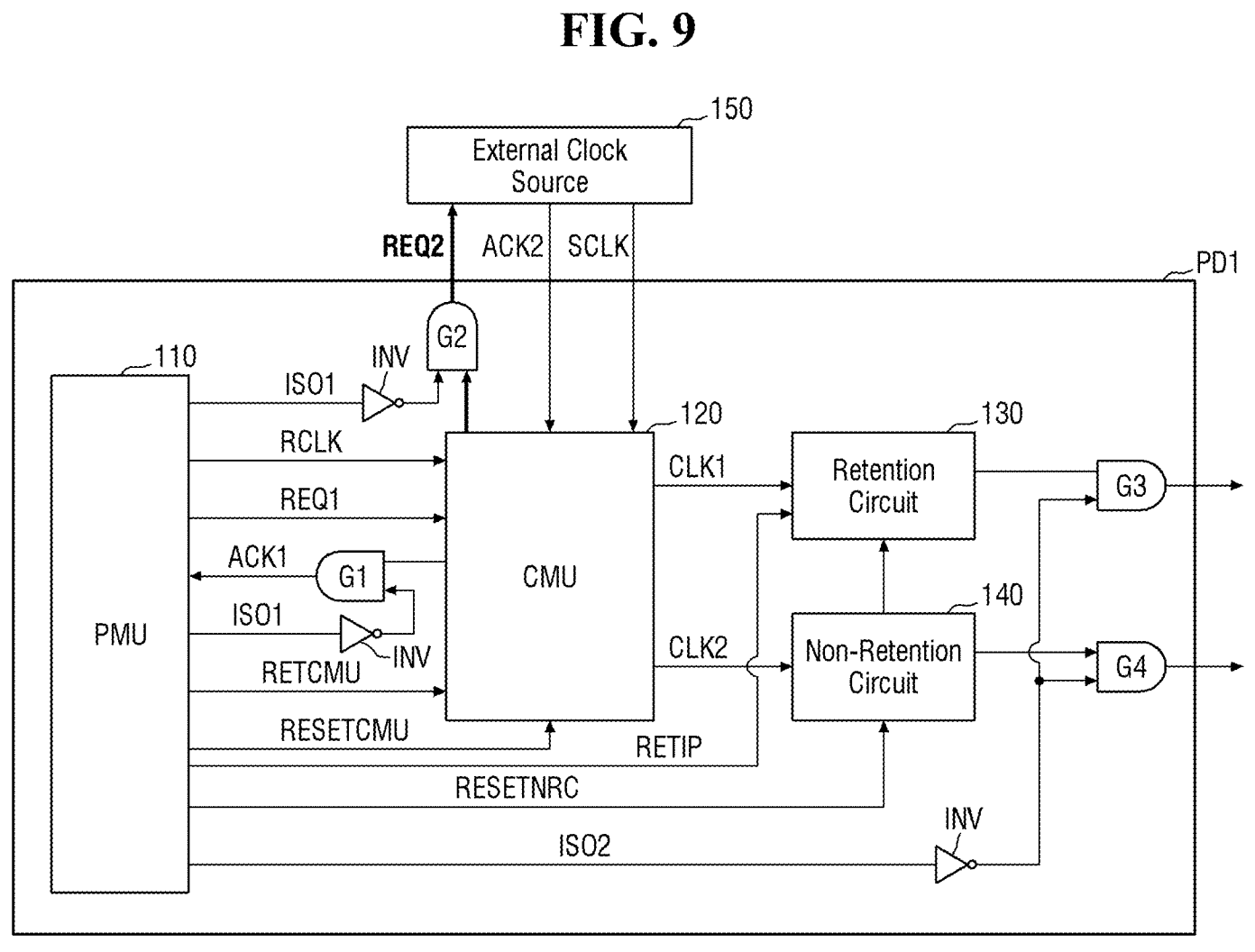
Figure 10:
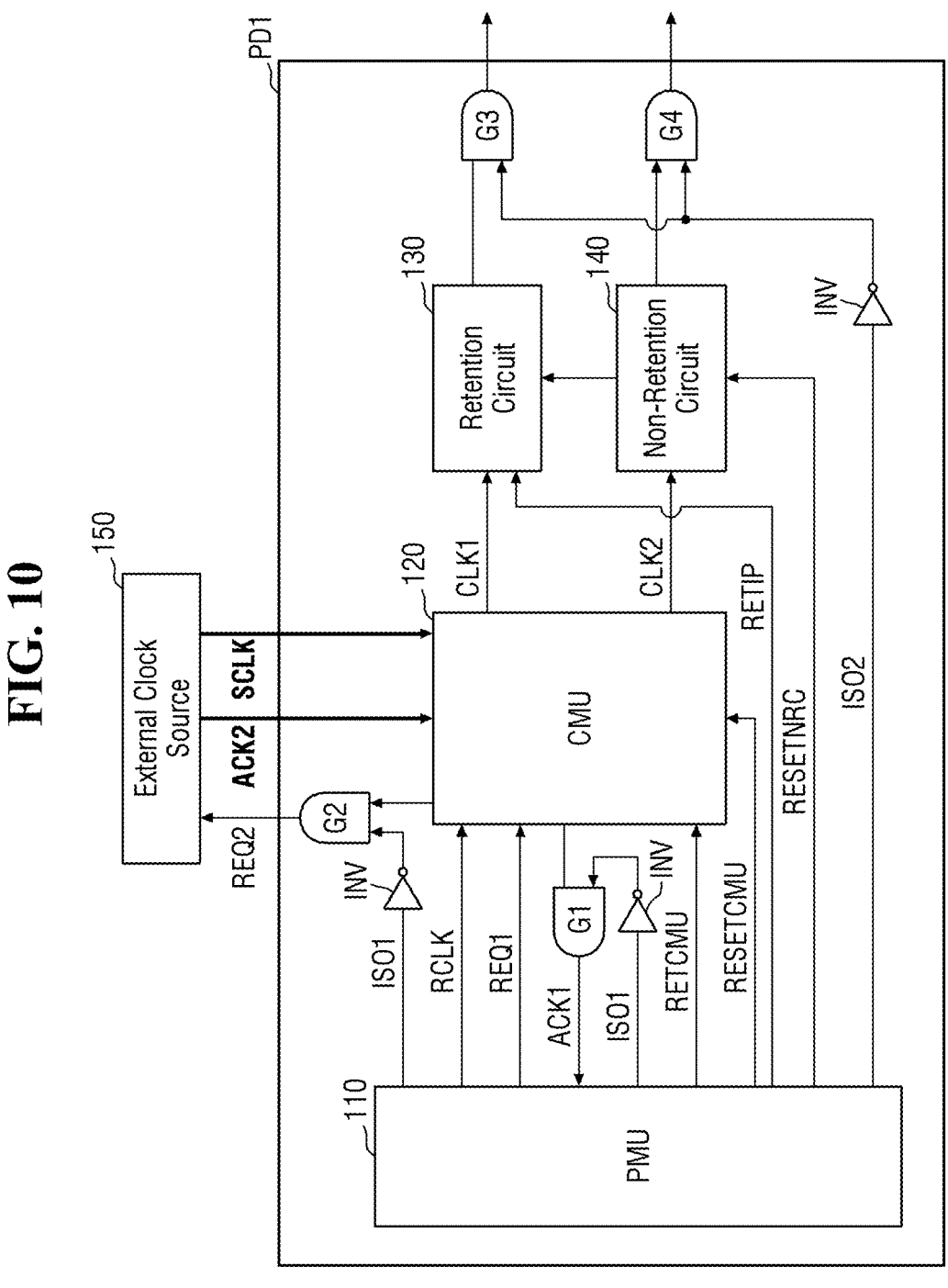

FIG. 8 is a timing diagram showing an operation of a semiconductor device (e.g., the semiconductor device 100 and first power domain PD1 of FIGS. 1-2) when the power gating operation is stopped. FIG. 9 and FIG. 10 are diagrams illustrating the operations shown in FIG. 8.

First, referring to FIG. 8, in in time interval S220, the power gating operation has been or is completed and power is supplied. Then, in time interval 210, the CMU 120 is controlled in the non-retention mode and the reference clock RCLK is provided to the CMU 120. Specific descriptions regarding these operations have been set forth above, and the foregoing descriptions also apply to the case of FIGS. 8 to 10.

Next, referring to FIG. 8, in time interval S220, the PMU 110 permits the output of the CMU 120 to be transmitted such that the CMU 120, which stops operating in the retention mode, may communicate, and the PMU 110 requests the CMU 120 to generate and output the operation clocks CLK1 and CLK2.

For example, referring to FIGS. 8 and 9, the PMU 110 may switch the first isolation signal ISO1 from H to L to permit the CMU 120 output (e.g., REQ2 and/or ACK1) to be transmitted.

Then, the PMU 110 may transmit, to the CMU 120, the first request signal REQ1 requesting the CMU 120 to generate and transmit the first and second operation clocks CLK1 and CLK2 to the retention circuit 130 and the non-retention circuit 140. For example, the PMU 110 may switch the first request signal REQ1 from L to H.

Upon receiving the first request signal REQ1, the CMU 120 may switch the second request signal REQ2 from L to H to request that the source clock SCLK be provided from the external clock source 150, and may transmit the second request signal REQ2 to the external clock source 150.

Next, referring to FIG. 8, in time interval S230, the CMU 120 may output, to the non-retention circuit 140, the operation clock CLK2 based on the source clock SCLK provided from the external clock source 150, such that the non-retention circuit 140 may be reset. Then, the CMU 120 transmits the response signal ACK1 indicating that the operation clock CLK2 has been output in S230.

Referring to FIG. 8 and FIG. 10, in response to the second request signal REQ2, the external clock source 150 may provide the source clock SCLK to the CMU 120 and may switch the second response signal ACK2 from L to H, and may transmit the source clock SCLK to the CMU 120. For example, the external clock source 150 may transmit the source clock SCLK to the CMU 120 in a full hand shaking scheme. Thus, full hand shaking operation may be realized by the PMU 110 switching the first isolation signal ISO1 from H to L.

The CMU 120 may generate the first and second operation clocks CLK1 and CLK2 based on the source clock SCLK provided from the external clock source 150, and may output the first operation clock CLK1 to the retention circuit 130, and may output the second operation clock CLK2 to the non-retention circuit 140.

In the time interval S230, the second reset signal RESETNRC provided from the PMU 110 to the non-retention circuit 140 continuously maintains L, which resets the non-retention circuit 140. While the second reset signal RESETNRC maintains L, the non-retention circuit 140 may receive the second operation clock CLK2, so that internal circuits of the non-retention circuit 140 may be reset. When (e.g., only when) the internal circuits of the non-retention circuit 140 are reset in this way, values stored in the non-retention circuit 140 may be trusted as valid data.

After outputting the first operation clock CLK1 to the retention circuit 130 and the second operation clock CLK2 to the non-retention circuit 140, the CMU 120 may output, to the PMU 110, the first response signal ACK1 indicating that the first operation clock CLK1 has been output to the retention circuit 130 and the second operation clock CLK2 has been output to the non-retention circuit 140. For example, the CMU 120 may switch the first response signal ACK1 from L to H.

As described above, due to the first isolation signal ISO1 being switched, the H signal is maintained at the first input terminal of the first logic gate G1, so that the first response signal ACK1 switching from L to H may be delivered to the PMU 110. Accordingly, the PMU 110 may monitor that the CMU 120 has completed outputting of the operation clocks CLK1 and CLK2.

Next, referring to FIG. 8, the reset of the non-retention circuit is deactivated and the output of the power domain is transmitted out of the power domain in time interval S240, as described with respect to FIG. 3. Duplicate descriptions will be omitted.

When a power gating operation is stopped and data is output again, it can be useful to ensure the reliability of the output data. For example, as described above, when the output of the retention circuit 130 in which data is maintained during a power gating operation is affected by the output of the non-retention circuit 140 in which data is not maintained during a power gating operation, it can be useful to ensure reliability of the output of the retention circuit 140.

In some implementations according to this disclosure, as described with respect to FIGS. 1 to 10, the PMU 110 monitors the operation of the CMU 120 to ensure the reliability of the output of the non-retention circuit 140, and controls the reliable data to be output to an external component. Accordingly, the reliability of the semiconductor device may be improved. Furthermore, the PMU 110 may provide an environment in which the CMU 120 may receive a clock in a full handshaking scheme with an external clock source 150.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

Although examples according to the present disclosure have been described with reference to the accompanying drawings, implementations of the present disclosure are not limited to the above examples, but may be implemented in various different forms. A person skilled in the art may appreciate that the present disclosure may be practiced in other concrete forms without changing the technical spirit or essential characteristics of the present disclosure. Therefore, it should be appreciated that the examples described above are not restrictive but illustrative in all respects.

What is claimed is:

1. A semiconductor device comprising:
a retention circuit configured to retain stored data during a power gating operation;
a non-retention circuit that loses stored data during the power gating operation;
a clock management unit (CMU) configured to provide a first operation clock to the retention circuit and provide a second operation clock to the non-retention circuit; and
a power management unit (PMU) configured to:
provide, to the CMU, a reference clock used by the CMU to generate the first and second operation clocks;
generate a first isolation signal that permits a first signal to be transmitted from the CMU, wherein the first signal indicates that the first operation clock is provided to the retention circuit and the second operation clock is provided to the non-retention circuit; and
generate a second isolation signal that permits a second signal to be transmitted from the retention circuit and permits a third signal to be transmitted from the non-retention circuit.

2. The semiconductor device of claim 1, wherein the retention circuit is configured to receive an output of the non-retention circuit and to output the second signal based on the received output of the non-retention circuit.

3. The semiconductor device of claim 1, wherein the PMU is configured to output the first isolation signal and to output the second isolation signal after outputting the first isolation signal.

4. The semiconductor device of claim 3, wherein the PMU is configured to:

provide the reference clock to the CMU after transmitting, to the CMU, a retention signal that stops a retention mode of the CMU; and output the first isolation signal after providing the reference clock.

5. The semiconductor device of claim 4, wherein the PMU is configured to:

receive, from the CMU, a response signal indicating that the CMU has output the first and second operation clocks; and output the second isolation signal based on receiving the response signal.

6. The semiconductor device of claim 4, comprising an external clock source configured to provide a source clock to the CMU, wherein the CMU is configured to:

after the PMU outputs the first isolation signal, transmit, to the external clock source, a request signal requesting the source clock; and receive a first response signal and the source clock from the external clock source.

7. The semiconductor device of claim 6, wherein the CMU is configured to:

generate and output the first and second operation clocks based on the source clock; and transmit, to the PMU, a second response signal indicating that the first and second operation clocks have been outputted, and wherein the PMU is configured to receive the second response signal from the CMU and output the second isolation signal based on receiving the second response signal.

8. The semiconductor device of claim 1, comprising a first logic gate configured to:

perform a first logical operation on the first isolation signal and the first signal output from the CMU; and transmit a result of the first logical operation to the PMU.

9. The semiconductor device of claim 8, further comprising:

a second logic gate configured to perform a second logical operation on the second isolation signal and the second signal output from the retention circuit and output a result of the second logical operation; and a third logic gate configured to perform a third logical operation on the second isolation signal and the third signal output from the non-retention circuit, and output a result of the third logical operation.

10. The semiconductor device of claim 8, comprising:

an external clock source configured to provide a source clock to the CMU; and a second logic gate configured to perform a second logical operation on the first isolation signal and a fourth signal output from the CMU, and transmit a result of the second logical operation to the external clock source.

11. The semiconductor device of claim 10, comprising:

a third logic gate configured to perform a third logical operation on the second isolation signal and the second signal output from the retention circuit, and output a result of the third logical operation; and a fourth logic gate configured to perform a fourth logical operation on the second isolation signal and the third signal output from the non-retention circuit, and output a result of the fourth logical operation.

12. The semiconductor device of claim 8, wherein the first logical operation includes an AND operation, and wherein the first logic gate includes an AND gate.

13. A semiconductor device comprising:

a retention circuit configured to retain stored data during a power gating operation;

a non-retention circuit that loses stored data during the power gating operation;

a clock management unit (CMU) configured to provide a first operation clock to the retention circuit, provide a second operation clock to the non-retention circuit, and output a response signal indicating that the first and second operation clocks have been outputted;

a power management unit (PMU) configured to:

provide, to the CMU, a reference clock used by the CMU to generate the first and second operation clocks;

output a first isolation signal that permits an output of the CMU to be transmitted; and output a second isolation signal that permits outputs of each of the retention circuit and the non-retention circuit to be transmitted; and a first logic gate configured to perform a first logical operation on the response signal output from the CMU and the first isolation signal, and provide a result of the first logical operation to the PMU.

14. The semiconductor device of claim 13, comprising:

an external clock source configured to provide a source clock to the CMU; and a second logic gate configured to:

perform a second logical operation on the first isolation signal and a request signal output from the CMU, wherein the request signal requests the source clock, and transmit a result of the second logical operation to the external clock source.

15. The semiconductor device of claim 14, comprising:

a third logic gate configured to perform a third logic operation on the second isolation signal and a signal output from the retention circuit, and output a result of the third logical operation; and a fourth logic gate configured to perform a fourth logical operation on the second isolation signal and a signal output from the non-retention circuit, and output a result of the fourth logical operation.

16. The semiconductor device of claim 13, further comprising:

a second logic gate configured to perform a second logic operation on the second isolation signal and a signal output from the retention circuit, and output a result of the second logical operation; and a third logic gate configured to perform a third logic operation on the second isolation signal and a signal output from the non-retention circuit, and output a result of the third logical operation.

17. The semiconductor device of claim 13, wherein the first logical operation includes an AND operation, and wherein the first logic gate includes an AND gate.

18. A method of operating a semiconductor device, wherein the semiconductor device includes:

a retention circuit configured to retain stored data during a power gating operation;

a non-retention circuit that loses stored data during the power gating operation;

a clock management unit (CMU) configured to provide an operation clock to each of the retention circuit and the non-retention circuit; and a power management unit (PMU) configured to provide, to the CMU, a reference clock used by the CMU to generate the operation clock, wherein the method comprises:

based on the power gating operation ending, outputting, by the PMU, the reference clock;

outputting, by the PMU, a first isolation signal that permits an output of the CMU to be transmitted;

outputting, by the PMU, to the CMU, a first request signal requesting the CMU to provide the operation clock to each of the retention circuit and the non-retention circuit;

transmitting, by the CMU, to an external clock source, a second request signal requesting a source clock used by the CMU to generate the operation clock, wherein the second request signal is transmitted based on the first request signal and the first isolation signal; and receiving, by the PMU, from the CMU, a first response signal indicating that the operation clock has been outputted, wherein the first response signal is received based on the first isolation signal.

19. The method of claim 18, further comprising:

based on receiving, by the PMU, the first response signal from the CMU, outputting, by the PMU, a second isolation signal that permits an output of each of the retention circuit and the non-retention circuit to be transmitted.

\*    \*    \*    \*    \*